(12) United States Patent
Choi et al.

(10) Patent No.: US 9,818,972 B2
(45) Date of Patent: Nov. 14, 2017

(54) ORGANIC LIGHT EMITTING DEVICE AND METHOD FOR PREPARING THE SAME

(71) Applicant: Samsung Display Co., Ltd., Yongin, Gyeonggi-Do (KR)

(72) Inventors: Sang-Jun Choi, Yongin (JP); Won-Duk Jung, Yongin (JP); Jeong-Lim Nam, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 937 days.

(21) Appl. No.: 14/022,078

(22) Filed: Sep. 9, 2013

(65) Prior Publication Data

US 2014/0070195 A1    Mar. 13, 2014

(30) Foreign Application Priority Data

Sep. 12, 2012 (KR) .................. 10-2012-0101144

(51) Int. Cl.
*H01L 51/54* (2006.01)
*H01L 51/52* (2006.01)

(52) U.S. Cl.
CPC ...... *H01L 51/5237* (2013.01); *H01L 51/5256* (2013.01)

(58) Field of Classification Search
CPC ..... H01L 51/0032; H01L 51/50; H01L 51/52; H01L 51/5237; H01L 51/524; H01L 51/5253; H01L 51/5256; C09D 183/06; C09D 143/04; C08L 83/04; C08L 83/06; C08L 2312/06; Y10T 428/23; C08G 77/20

USPC ....... 428/690, 691, 971, 411.4, 336; 427/58, 427/66; 438/26; 313/500–512; 257/40, 257/88–104, E51.001–E51.052; 252/301.16–301.35

See application file for complete search history.

(56) References Cited

U.S. PATENT DOCUMENTS

| | | | |
|---|---|---|---|
| 6,268,695 B1 * | 7/2001 | Affinito | H01L 51/5256 313/504 |
| 2004/0018305 A1 | 1/2004 | Pagano et al. | |
| 2007/0278950 A1 * | 12/2007 | Hu | H01L 51/5243 313/512 |
| 2007/0281174 A1 | 12/2007 | Moro et al. | |

FOREIGN PATENT DOCUMENTS

| | | |
|---|---|---|
| JP | 2007214543 A * | 8/2007 |
| JP | 2008-153602 | 7/2008 |
| KR | 10-2010-0051810 | 5/2010 |
| KR | 10-2011-0020130 A | 3/2011 |

OTHER PUBLICATIONS

Machine translation of JP2007-214543. dated Aug. 23, 2007.*

* cited by examiner

*Primary Examiner* — Andrew K Bohaty
(74) *Attorney, Agent, or Firm* — Knobbe, Martens, Olson & Bear, LLP

(57) ABSTRACT

An organic light-emitting device with a sealing layer covering a light-emitting diode, wherein the sealing layer comprises n number of sealing units, each comprising a sequential stack of an organic film and an inorganic film, wherein n is an integer of 1 or greater and a method of manufacturing the same.

20 Claims, 1 Drawing Sheet

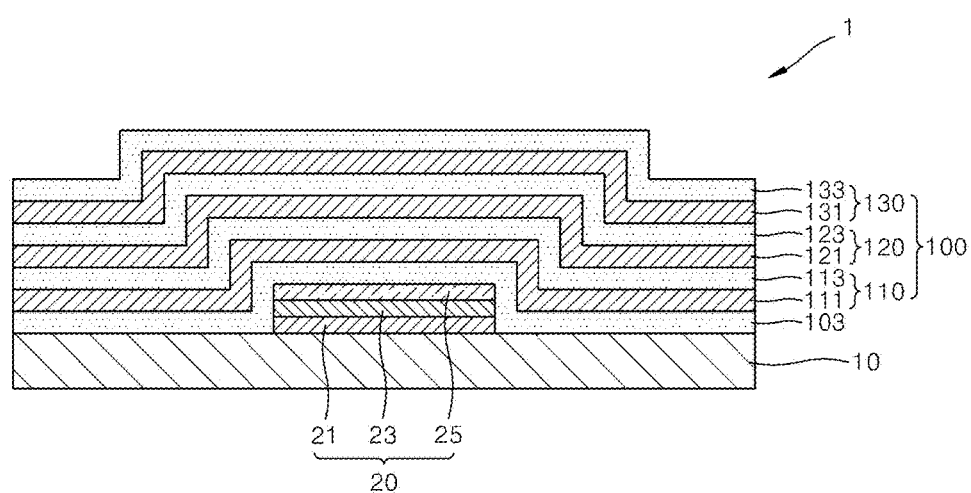

ORGANIC LIGHT EMITTING DEVICE AND METHOD FOR PREPARING THE SAME

CROSS-REFERENCE TO RELATED APPLICATIONS

This application claims the benefit of Korean Patent Application No. 10-2012-0101144, filed on Sep. 12, 2012, in the Korean Intellectual Property Office, the disclosure of which is incorporated herein in its entirety by reference.

BACKGROUND

Field

The present embodiments relate to an organic light-emitting device and a method of manufacturing the same.

Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

A typical organic light-emitting device may include an anode, a cathode, and an organic layer disposed between the anode and the cathode. The organic layer may include a hole transport layer, an emission layer, an electron transport layer, and the cathode. When a voltage is applied between the anode and the cathode, holes injected from the anode move to the EML via the HTL, and electrons injected from the cathode move to the EML via the ETL. The holes and electrons recombine in the emission layer to generate excitons. When the exitons drop from an excited state to a ground state, light is emitted. An organic light-emitting device including such organic light-emitting diodes may further include a driving transistor or a switching transistor.

The organic light-emitting diode may be deteriorated by oxygen and/or moisture. Thus, to implement a high-quality organic light-emitting device, an effective sealing structure for the organic light-emitting diode is required.

SUMMARY

The present embodiments provide an organic light-emitting device including a sealing unit for preventing oxygen and/or moisture permeation into a light-emitting diode to provide longer lifetime, and a method of manufacturing the organic light-emitting device.

According to an aspect of the present embodiments, there is provided an organic light-emitting device including: a substrate; a light-emitting diode disposed on the substrate and including a first electrode, an emission layer, and a second electrode; and a sealing layer covering the light-emitting diode, wherein the sealing layer includes n number of sealing units, each including a sequential stack of an organic film and an inorganic film, wherein n is an integer of 1 or greater; and the organic film includes a cured product of an organic film forming composition including a silicon-based compound with at least two terminal groups represented by Formula 1 below:

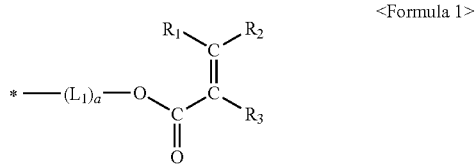

<Formula 1> wherein, in Formula 1 above, $L_1$ is a substituted or unsubstituted $C_1$-$C_{60}$ alkylene group or a substituted or unsubstituted $C_2$-$C_{60}$ alkenylene group;

a is an integer from 0 to 2; and $R_1$ to $R_3$ are each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

The silicon-based compound may be a compound represented by Formula 2 or 3 below:

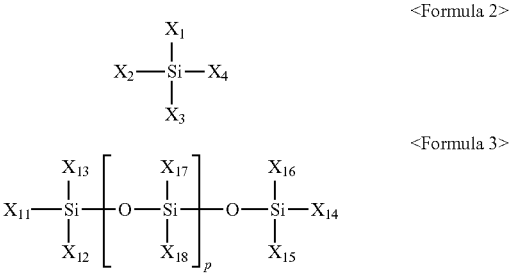

<Formula 2>

<Formula 3> wherein, in Formulae 2 and 3, $X_1$ to $X_4$ and $X_{11}$ to $X_{18}$ are each independently a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or a terminal group represented by Formula 1, wherein at least two of $X_1$ to $X_4$ are terminal groups represented by Formula 1, and at least two of $X_{11}$ to $X_{18}$ are terminal groups represented by Formula 1; and p is an integer from 0 to 10.

The silicon-based compound may be represented by Formula 3A below:

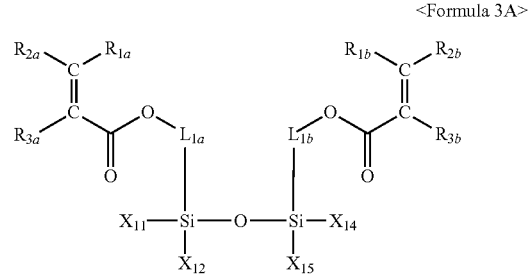

<Formula 3A> wherein, in Formula 3A, $L_{1a}$ and $L_{1b}$ are each independently one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof; and $R_{1a}$, $R_{2a}$, $R_{3a}$, $X_{11}$, $X_{12}$, $R_{1b}$, $R_{2b}$, $R_{3b}$, $X_{14}$ and $X_{15}$ are each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof.

The organic film forming composition may further include a curable material and an initiator. The curable material may include at least one of an acrylate-based material, a methacrylate-based material, a vinyl-based material, an epoxy-based material, a urethane-based material, and a cellulose-based material. The initiator may include at least one of an organic peroxide-based compound, an azo-based compound, a benzophenone-based compound, an oxime-based compound, and a phosphine oxide-based compound.

The inorganic film may include at least one of a metal, a metal nitride, a metal oxide, and a metal oxynitride.

The sealing layer may further include a lower inorganic film disposed between the organic light-emitting diode and the sealing unit.

The organic light-emitting device may further include at least one of a capping layer and a protective layer between the light-emitting diode and the sealing unit.

According to another aspect of the present embodiments, there is provided an organic light-emitting device including: a substrate; an organic light-emitting diode disposed on the substrate and including a first electrode, an emission layer, and a second electrode; and a sealing layer covering the organic light-emitting diode, wherein the sealing layer has a stack structure including a first organic film, a first inorganic film, a second organic film, a second inorganic film, a third organic film, and a third inorganic film that are sequentially stacked on the organic light-emitting diode; the first organic film, the second organic film, and the third organic film each independently includes a cured product of an organic film forming composition including a silicon-based compound represented by Formula 3A above; and the first inorganic film, the second inorganic film, and the third inorganic film each independently include at least one of a metal, a metal nitride, a metal oxide, and a metal oxynitride. The sealing layer may further include a lower inorganic film disposed between the organic light-emitting diode and the first organic film.

According to another aspect of the present embodiments, there is provided a method of manufacturing an organic light-emitting device, the method including: forming an organic light-emitting diode including a first electrode, an emission layer, and a second electrode on a substrate; and forming a sealing layer to cover the organic light-emitting diode, the sealing layer comprising at least n number of sealing units each including an organic film and an inorganic film sequentially stacked on the organic light-emitting diode, wherein n is an integer of 1 or greater, wherein the organic film is formed by applying an organic film forming composition including a silicon-based compound with at least two terminal groups represented by Formula 1 above, onto a region where the organic film is to be formed, and curing the organic film forming composition.

In the organic light-emitting device manufacturing method, the organic film forming composition may be applied onto the region where the organic film is to be formed, by using flash evaporation, and the organic film forming composition applied onto the region where the organic film is to be formed may be cured by being exposed to light.

In the organic light-emitting device manufacturing method, the inorganic film may be formed by reactive sputtering or chemical vapor deposition (CVD) using oxygen gas or oxygen plasma.

BRIEF DESCRIPTION OF THE DRAWINGS

The above and other features and advantages of the present embodiments will become more apparent by describing in detail example embodiments thereof with reference to the attached drawing in which:

The Figure is a schematic sectional view of an organic light-emitting device according to an embodiment.

DETAILED DESCRIPTION OF THE PREFERRED EMBODIMENT

As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which example embodiments of the present disclosure are shown.

Referring to the Figure, an organic light-emitting device 1 according to an embodiment includes a substrate 10, a light-emitting diode 20 disposed on the substrate 10, and a sealing layer 100 covering the light-emitting diode 20.

The substrate 10, which may be any substrate that is used in typical flat display devices, may be a glass substrate or a transparent plastic substrate with high mechanical strength, thermal stability, transparency, surface smoothness, ease of handling, and water resistance. The substrate 10 may comprise an inorganic material such as a transparent glass material mainly comprising $SiO_2$, or an insulating organic material such as a transparent plastic material. The insulating organic material may be, for example, selected from the group consisting of polyethersulphone (PES), polyacrylate (PAR), polyetherimide (PEI), polyethylene naphthalate (PEN), polyethyeleneterephthalate (PET), polyphenylene sulfide (PPS), polyallylate, polyimide, polycarbonate (PC), cellulose tri acetate (TAC), and cellulose acetate propionate (CAP), but is not limited to these materials.

The organic light-emitting diode 20 including a first electrode 21, an organic layer 23, and a second electrode 25 is disposed on the substrate 10.

The first electrode 21 may be formed by depositing or sputtering a first electrode-forming material on the substrate 10. When the first electrode 21 constitutes an anode, a material having a high work function may be used as the first electrode-forming material to facilitate hole injection. The first electrode 21 may be a reflective electrode or a transmission electrode. Transparent and conductive materials such as ITO, IZO, $SnO_2$, and ZnO may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 21 may have a single-layer structure or a multi-layer structure including at least two layers. For example, the first electrode 13 may have a three-layered structure of ITO/Ag/ITO, but is not limited thereto.

The organic layer 23 is disposed on the first electrode 21.

The organic layer 23 may include an emission layer (EML) and at least one of a hole injection layer (HIL), a hole transport layer (HTL), a buffer layer, an electron blocking layer (EBL), a hole blocking layer (HBL), an electron transport layer (ETL) and an electron injection layer (EIL). For example, the organic layer 23 may have a stacked structure including a HIL, a HTL, an EML, an ETL, and an EIL, which are stacked in this.

First, the HIL may be formed on the first electrode 21 by vacuum deposition, spin coating, casting, Langmuir-Blodgett (LB) deposition, or the like.

The HIL may comprise any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline/poly(4-styrenesulfonate (PANI/PSS).

Then, a HTL may be formed on the HIL by using vacuum deposition, spin coating, casting, Langmuir-Blodgett (LB) deposition, or the like.

Non-limiting examples of suitable known HTL forming materials are N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

The emission layer may include a host, and a dopant, Non-limiting examples of the host material are aluminum this(8-hydroxyquinoline) (Alq3), 4,4'-N,N'-dicarbazole-biphenyl (CBP), 9,10-di(naphthalene-2-yl)anthracene (ADN), 3,5-tris(N-phenylbenzimidazole-2-yl)benzene) (TPBI), and 3-tert-butyl-9,10-di(naphth-2-yl)anthracene (TBADN).

Non-limiting examples of blue dopants are compounds represented by the following formulae.

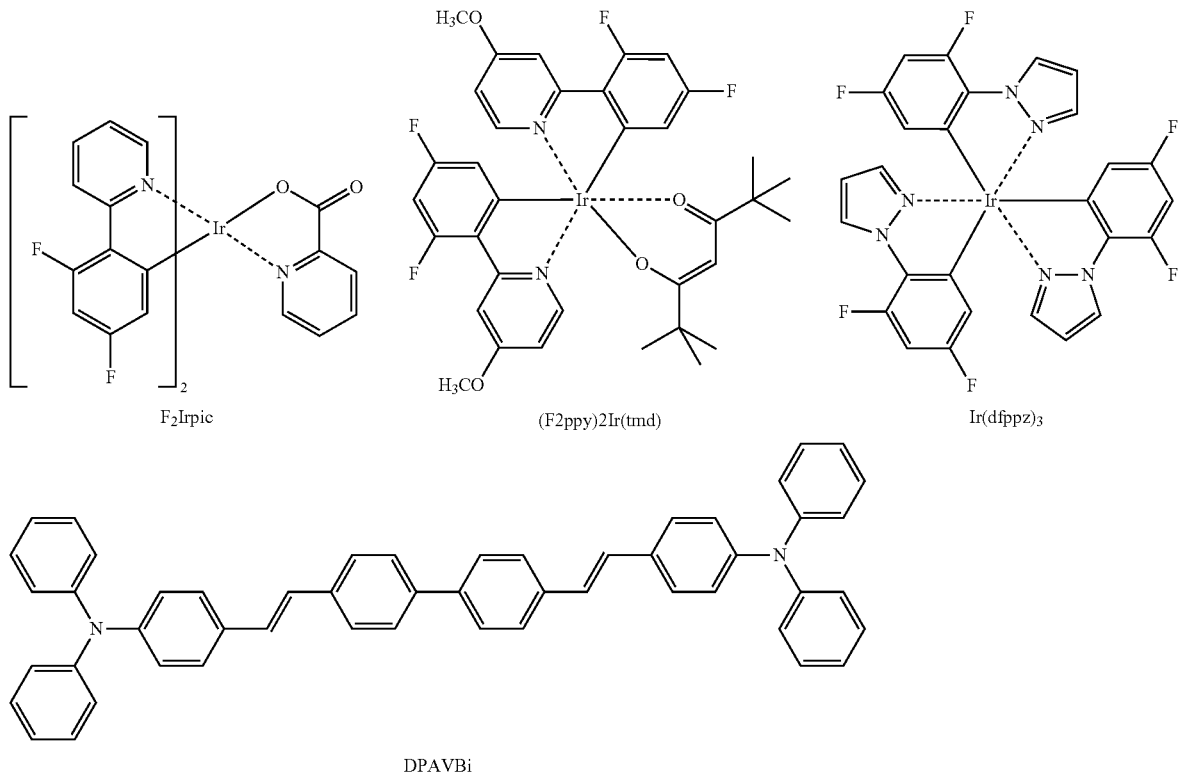

Non-limiting examples of the red dopant are compounds represented by the following formulae.

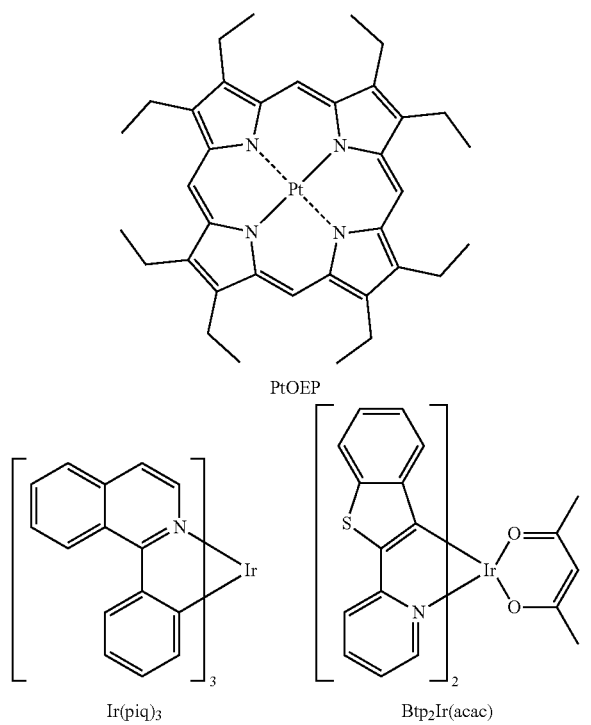

Non-limiting examples of the green dopant are compounds represented by the following formulae.

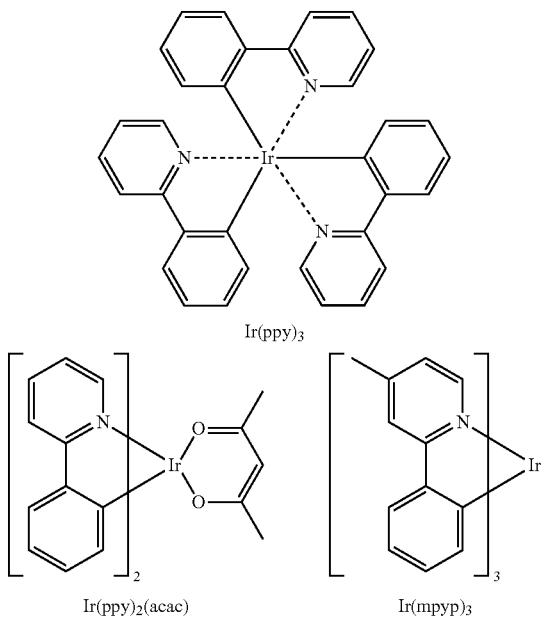

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may be any material that can stably transport electrons injected from an electron injecting electrode (cathode). Non-limiting examples of materials for forming the ETL are a quinoline derivative, such as tris(8-quinolinorate)aluminum (Alq3), TAZ, BAlq, beryllium bis(benzoquinolin-10-olate (Bebq2), 9,10-di(naphthalene-2-yl)anthracene (ADN), Compound 201, and Compound 202, but are not limited thereto.

<Compound 201>

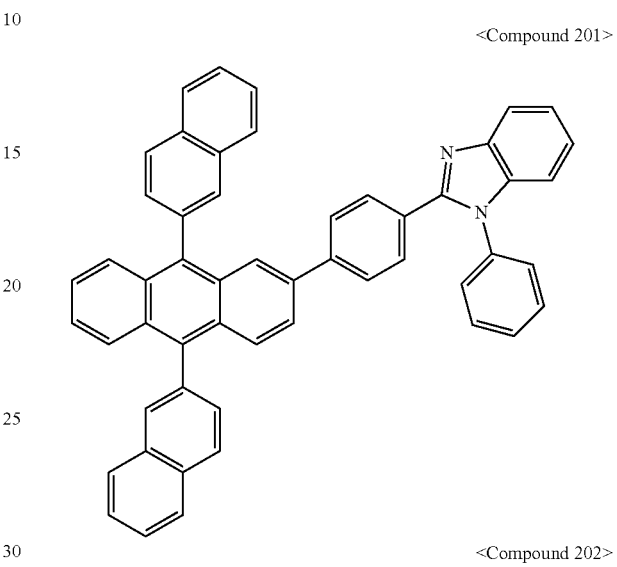

<Compound 202>

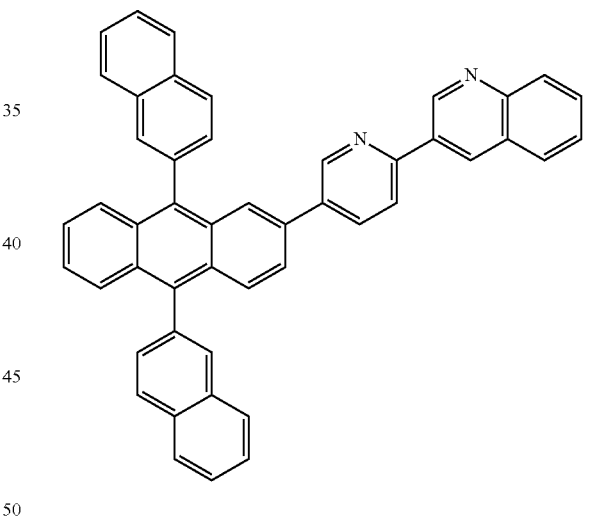

In some embodiments the ETL may further include a metal-containing material, in addition to any known electron-transporting organic compound.

The metal-containing material may include a lithium (Li) complex. A non-limiting example of the Li complex is lithium quinolate (LiQ).

An EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO, which are known in the art. The deposition and coating conditions for forming the EIL 18 may be similar to those for the formation of the HIL, though the deposition and coating conditions may vary according to the material that is used to form the EIL 18.

The second electrode 25 is disposed on the organic layer 23. The second electrode 25 may be a cathode, which is an electron injecting electrode. A metal for forming the second electrode 9 may be a metal, an alloy, an electrically conductive compound, which have a low-work function, or a mixture thereof. In this regard, the second electrode 9 may comprise lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may comprise indium tin oxide (ITO) or indium zinc oxide (IZO).

The organic light-emitting device of the Figure includes the sealing layer 100 covering the light-emitting diode 20. The sealing layer 100 may prevent permeation of moisture and/or oxygen from an external environment into the organic light-emitting diode 20, so that the organic light-emitting device 1 may have long lifetime.

The sealing layer 100 has a stack structure of a first sealing unit 110, a second sealing unit 120, and a third sealing unit 130 that are sequentially stacked on the organic light-emitting diode 20. For example, the sealing layer 100 includes three sealing units (n=3) as described above. The first sealing unit 110 includes a first organic film 111 and a first inorganic film 113 that are sequentially stacked on the organic light-emitting diode 20; the second sealing unit 120 includes a second organic film 121 and a second inorganic film 123 that are sequentially stacked on the organic light-emitting diode 20; the third sealing unit 130 includes a third organic film 131 and a third inorganic film 133 that are sequentially stacked on the organic light-emitting diode 30.

The first organic film 111, the second organic film 121, and the third organic film 131 may planarize underlying structures thereof, and may provide the sealing layer 110 with flexibility.

The first organic film 111, the second organic film 121, and the third organic film 131 include a cured product of an organic film forming composition including a silicon-based compound with at least two terminal groups represented by Formula 1 below.

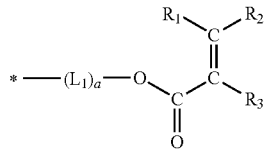

<Formula 1>

In Formula 1 above, $L_1$ is a substituted or unsubstituted $C_1$-$C_{60}$ alkylene group, or a substituted or unsubstituted $C_2$-$C_{60}$ alkenylene group. For example, in Formula 1, $L_1$ may be one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof. In some embodiments, $L_1$ in Formula 1 may be a methylene group, an ethylene group, a propylene group, a butylene group, a pentylene group, a hexylene group, a heptylene group, or an octylene group.

In Formula 1, a may be an integer from 0 to 2. If a is 0, $L_1$ is not present in Formula 1. If a is 2, two $L_1$ may be the same or different.

In Formula 1 above, $R_1$ to $R_3$ are each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

In some embodiments, in Formula 1 above, $R_1$ to $R_3$ may be each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; a $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof.

In some embodiments, in Formula 1, $R_1$ and $R_2$ may be each independently a hydrogen atom, a methyl group, an ethyl group, a propyl group, a butyl group, a pentyl group, a hexyl group, a heptyl group, or an octyl group (for example, a hydrogen atom); and $R_3$ may be a methyl group, an ethyl group, a propyl group, a butyl group, a pentyl group, a hexyl group, a heptyl group, or an octyl group (for example, a methyl group), but are not limited thereto.

In some embodiments the silicon-based compound may be a compound represented by Formula 2 or 3 below:

<Formula 2>

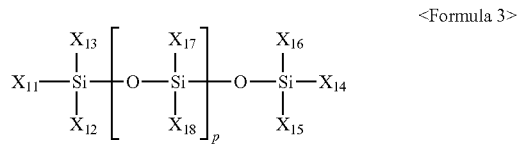

<Formula 3>

In Formulae 2 and 3 above, $X_1$ to $X_4$ and $X_{11}$ to $X_{18}$ may be each independently a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or a terminal group represented by Formula 1 above, wherein at least two of $X_1$ to $X_4$ is terminal groups represented by Formula 1 above; at least two of $X_{11}$ to $X_{18}$ is a terminal group represented by Formula 1 above; and p is an integer from 0 to 10.

In some embodiments, in Formulae 2 and 3, $X_1$ to $X_4$ and $X_{11}$ to $X_{18}$ may be each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; a $C_1$-$C_{20}$ alkyl group; a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof; and a terminal group represented by Formula 1 above, wherein at least two of $X_1$ to $X_4$ is terminal groups represented by Formula 1 above; and at least two of $X_{11}$ to $X_{18}$ is terminal groups represented by Formula 1 above.

In Formula 3, p may be 0, 1, 2, 3, 4, or 5. If p is 2 or greater, at least two units in "[ ]" may be the same or different.

In some embodiments the silicon-based compound may be a compound represented by Formula 3A below:

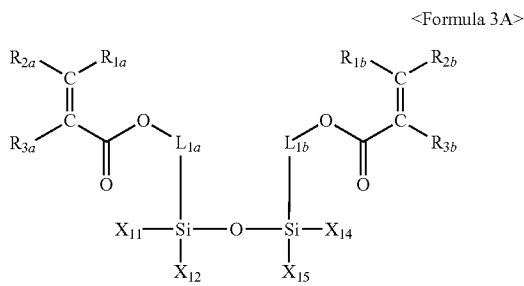

<Formula 3A>

In Formula 3A, $X_{11}$, $X_{12}$, $X_{14}$, and $X_{15}$ may be defined as described above herein. The above-description of $L_1$ may be referred to as descriptions of $L_{1a}$ and $L_{1b}$, the above-description of $R_1$ may be referred to as descriptions of $R_{1a}$ and $R_{1b}$, the above-description of $R_2$ may be referred to as descriptions of $R_{2a}$ and $R_{2b}$, and the above-description of $R_3$ may be referred to as descriptions of $R_{3a}$ and $R_{3b}$.

In some embodiments, in Formula 3A above, $L_{1a}$ and $L_{1b}$ may be each independently one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof; and $R_{1a}$, $R_{2a}$, $R_{3a}$, $X_{11}$, $X_{12}$, $R_{1b}$, $R_{2b}$, $R_{3b}$, $X_{14}$, and $X_{15}$ may be each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; a $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof, but are not limited thereto.

In some embodiments, the silicon-based compound may be a compound represented by Formula 3A above, wherein, in Formula 3A, $L_{1a}$ and $L_{1b}$ may be each independently a methylene group, an ethylene group, a propylene group, a butylene group, a pentylene group, a hexylene group, a heptylene group, or an octylene group; $R_{3a}$, $X_{11}$, $X_{12}$, $R_{3b}$, $X_{14}$, and $X_{15}$ may be each independently a methyl group, an ethyl group, a propyl group, a butyl group, a pentyl group, a hexyl group, a heptyl group, or an octyl group (for example, a methyl group); and $R_{1a}$, $R_{2a}$, $R_{1b}$, and $R_{2b}$ may be a hydrogen atom, a methyl group, an ethyl group, a propyl group, a butyl group, a pentyl group, a hexyl group, a heptyl group, or an octyl group (for example, a hydrogen atom), but are not limited thereto.

The silicon-based compound may have a weight average molecular weight of from about 200 to about 600, and a viscosity of from about 1 cp to about 30 cp, but is not limited thereto. When the weight average molecular weight and the viscosity of the silicon-based compound are within these ranges, the first organic film 111, the second organic film 121, and the third organic film 131 may each have a thickness and/or strength that are sufficient to prevent permeation of oxygen and/or moisture into the organic light-emitting diode 20, and have improved planarizing characteristics. Furthermore, when the silicon-based compound is formulated as the organic film forming composition, applying the organic film forming composition onto a region where the organic film is to be formed may be facilitated.

The silicon-based compounds for the compositions for forming the first organic film 111, the second organic film 121, and the third organic film 131 may be the same or different within the above-defined conditions.

The above-described silicon-based compound in the compositions for forming the first organic film 111, the second organic film 121, and the third organic film 131 may serve as a start material initiating reaction for curing the each organic film forming composition. Due to the inclusion of at least two terminal groups represented by Formula 1, the silicon-based compound may contribute forming a polymer organic film with a highly cross-linked and rigid network structure.

The first organic film 111, the second organic film 121, and the third organic film 131 may have a Si—C bond originating from the silicon of the silicon-based compound. This Si—C bond may be converted into a Si—O bond due to oxygen ions, oxygen radicals, or oxygen plasma that is used when forming the first inorganic film 113 on the first organic film 111, the second inorganic film 123 on the second organic film 121, and/or the third inorganic film 133 on the third organic film 131, thus resulting in, for example, $SiO_2$ in the first organic film 111, the second organic film 121, and the third organic film 131. This should be distinguished from when Si is not included in the organic film forming composition. For example, when an organic film including only carbon without Si is exposed to oxygen ions, oxygen radicals, or oxygen plasma, the carbon may be converted into a C—O bond through reaction with the oxygen ions, oxygen radicals or oxygen plasma, and thus be released from the organic film as $CO_2$, which is called "outgassing". The outgassing of $CO_2$ may result in a migration path for moisture and/or oxygen in the sealing layer 100, and may damage the organic light-emitting diode 20 if $CO_2$ reaches the organic light-emitting diode 20. Unlike these drawbacks from outgassing, according to the present disclosure, outgassing from The first organic film 111, the second organic film 121, and the third organic film 131 may be substantially prevented when forming the first inorganic film 113, the second inorganic film 123, and the third inorganic film 133 thereon, respectively, so that the sealing layer 100 may effectively seal the organic light-emitting diode 20.

The organic film forming compositions used for forming the first organic film 111, the second organic film 121, and the third organic film 131 may further include a curable material and an initiator.

The curable material may be any known material curable by heat and/or light. The curable material may serve as a start material for curing reaction along with the above-described silicon-based compound, and contribute forming a polymer organic film with highly cross-linked network structure.

For example, the curable material may include at least one of acrylate-based materials, methacrylate-based materials, vinyl-based materials, epoxy-based materials, urethane-based materials, cellulose-based materials, and silane-based materials, but is not limited thereto.

Non-limiting examples of the acrylate-based material are butylacrylate, ethylhexylacrylate, 2-hydroxyethylacrylate, and trimethylopropane triacrylate. Non-limiting examples of the methacrylate-based material are propyleneglycolmethacrylate, tetrahydrofurfuryl methacrylate, 1,10-decamethyleneglycol dimethacrylate and triethylene glycol dimethacrylate. Non-limiting examples of the vinyl-based material are vinylacetate and N-vinylpyrrolidone. Non-limiting examples of the epoxy-based materials are cycloaliphatic epoxide, epoxy acrylate, vinyl epoxy, and epoxy silicate. A non-limiting example of the urethane-based material is urethane acrylate. A non-limiting example of the cellulose-based material is cellulose nitrate.

When the organic film forming composition further includes a curable material as described above, an amount of the silicon-based compound may be from about 5 mol % to about 80 mol %, and in some embodiments, from about 10 mole to about 60 mol %, based on 100 mole % as a total of the silicon-based compound and the curable material, but is not limited thereto. When the amount of the silicon-based compound is within these ranges, the first organic film 111, the second organic film 121, and the third organic film 131 may each have a thickness and/or strength that are sufficient to prevent permeation of oxygen and/or moisture into the organic light-emitting diode 20, and have improved planarizing characteristics. Furthermore, when the silicon-based compound is formulated as the organic film forming composition, applying the organic film forming composition onto a region where the organic film is to be formed may be facilitated.

The initiator may be selected from among materials known as an initiator of reaction for curing the organic film forming composition as described above.

Non-limiting examples of the initiator are thermal initiators, such as an organic peroxide-based compound, and an azo-based compound; and photo initiators, such as a benzophenone-based compound, an oxime-based compound, and a phosphine oxide-based compound.

Non-limiting examples of the organic peroxide-based compound are benzoyl peroxide, t-butyl perbenzoate, o-methylbenzoyl peroxide, p-methylbenzoylperoxide, di-t-butyl peroxide, dicumyl peroxide, 1,1-bis(t-butylperoxy)-3,3,5-trimethylcyclohexane, 1,1-di(t-butylperoxy)cyclohexane, 2,5-dimethyl-2,5-di(t-butylperoxy)hexane, 2,5-dimethyl-2,5-di(t-butylperoxy)hexane, 1,6-bis(p-toluoylperoxycarbonyloxy)hexane, and di(4-methylbenzoylperoxy)hexamethylene biscarbonate.

Non-limiting examples of the azo-based compound are 2'-azobis(4-methoxy-2,4-dimethylvaleronitrile, 2,2'-azobis(2,4-dimethyl)valeronitrile, azobisisobutyronitrile, and 2,2'-azobis(2-methylbutyronitrile).

Non-limiting examples of the benzophenone-based compound are 2-hydroxy-2-methyl-1-phenyl-1-propanone, 2-hydroxy-1-[4-(2-hydroxyethoxy)phenyl]-2-methyl-1-propanone, alpha-dimethoxy-alpha-phenylacetophenone), 2-benzyl-2-(dimethylamino)-1-[4-(4-morpholinyl)phenyl]-1-butanone, and 2-methyl-1-[4-(methylthio)phenyl]-2-(4-morpholinyl)-1-propanone).

Non-limiting examples of the oxime-based compound are (hydroxyimino)cyclohexane, 1-[4-(phenylthio)phenyl]-octane-1,2-dione-2-(O-benzoyloxime), 1-[9-ethyl-6-(2-methylbenzoyl)-9H-carbazol-3-yl]-ethanone-1-(O-acetyloxime), trichloromethyl-triazine derivatives, 4-(4-methoxystyryl)-2,6-trichloromethyl-1,3,5-triazine, 4-(4-methoxyphenyl)-2,6-trichloromethyl-1,3,5-triazine, and α-aminoketone(1-(4-morpholinophenyl)-2-dimethylamino-2-benzyl-butan-1-one).

Non-limiting examples of the phosphine oxide-based material are diphenyl (2,4,6-trimethylbenzoyl)-phosphine oxide (TPO), and phenyl bis(2,4,6-trimethyl benzoyl) phosphine oxide (BAPO).

An amount of the initiator may be selected to be within common ranges in which curing reaction of the silicon-based compound and the curable material may be initiated. In some embodiments, the amount of the initiator may be selected from a range of from about 0.5 mol % to about 10 mol % based on 100 mol % of a total of the silicon-based compound and the curable material as described above.

The first organic film 111, the second organic film 121, and the third organic film 131 may each independently have a thickness of about 0.1 μm to about 50 μm, and in some embodiments, a thickness of from about 1 μm to about 10 μm. When the thicknesses of the first organic film 111, the second organic film 121, and the third organic film 131 are within these ranges, the first organic film 111, the second organic film 121, and the third organic film 131 may each effectively planarize the underlying layer. The thicknesses of the first organic film 111, the second organic film 121, and the third organic film 131 may be the same or different.

The first inorganic film 113, the second inorganic film 123, and the third inorganic film 133 may prevent permeation of moisture and/or oxygen from an external environment into the light-emitting diode 20.

The first inorganic film 113, the second inorganic film 123, and the third inorganic film 133 may include a material selected from among the inorganic materials known as sealing layer materials. For example, the first inorganic film 113, the second inorganic film 123, and the third inorganic film 133 may each independently include at least one of metal, metal nitride, metal oxide, and metal oxynitride. In some embodiments, the first inorganic film 113, the second inorganic film 123, and the third inorganic film 133 may each independently include at least one of aluminum nitride, aluminum oxide, and aluminum oxynitride, but is not limited thereto. In some other embodiments, the first inorganic film 113, the second inorganic film 123, and the third inorganic film 133 may each independently include at least one of $SiO_2$, SiC, SiN, SiON, $In_2O_3$, $TiO_2$ and $Al_2O_3$, but are not limited thereto. The first inorganic film 113, the second inorganic film 123, and the third inorganic film 133 may each include the same material or a different material.

The first inorganic film 113, the second inorganic film 123, and the third inorganic film 133 may each independently have a thickness of from about 100 Å to about 5000

Å, and in some embodiments, a thickness of from about 500 Å to about 3000 Å, but are not limited thereto. When the thicknesses of the first inorganic film 113, the second inorganic film 123, and the third inorganic film 133 are within these ranges, the sealing layer 110 may have improved sealing characteristics.

The first inorganic film 113, the second inorganic film 123, and the third inorgnaic film 133 may be formed using sputtering, reactive sputtering, chemical vapor deposition (CVD), plasma-enhanced chemical vapor deposition (PECVD), evaporation, electron cyclotron resonance plasma-enhanced chemical vapor deposition (ECR-PECVD), physical vapor deposition, atomic-layer deposition, or the like. For example, the first inorganic film 113 may be formed using reactive sputtering or chemical vapor deposition (CVD) using oxygen gas or oxygen plasma, but is not limited thereto.

The first inorganic film 113, the second inorganic film 123, and the third inorganic film 133 include inorganic materials as described above, and thus may be formed by a method using relatively high-energy, for example, by plasma-enhanced chemical vapor deposition (CVD).

For example, when forming the first inorganic film 113 by CVD in an oxygen plasma, a surface of the first organic film 111 may be exposed to oxygen ions, oxygen radicals, or UV rays generated from oxygen plasma, which have a sufficient energy to damage (for example, to decompose) the organic material in the first organic film 111.

However, since the first organic film 111 includes a cured product of the organic film forming composition including the silicon-based compound as described above, which is a polymer with a highly cross-linked rigid network structure, the first organic film 111 may be durable against high energy applied in forming the first inorganic film 113.

For example, when forming the first inorganic film 113 using oxygen plasma, Si—C bonds in the first organic film 111 may be converted into Si—O bonds due to oxygen ions or oxygen radicals generated from the oxygen plasma, and thus may remain, for example, in the form of $SiO_2$ in the first organic film 111. Even when the first inorganic film 113 is formed in a high energy condition, for example, using oxygen plasma, outgassing from the first organic film 111 may be substantially prevented. In the same principle, when the second inorganic film 123 and the third inorganic film 133 are generated in a high energy condition using oxygen plasma, outgassing from the second organic film 121 and the third organic film 131 may be substantially prevented. Therefore, the sealing layer 100 may effectively seal the organic light-emitting diode 20 without causing outgassing, while being formed and/or while the organic light-emitting device 1 is stored or operated and thus the organic light emitting device may have long lifetime.

The sealing layer 100 of the organic light-emitting devices 1 may further include a lower inorganic film 103 between the organic light-emitting diode 20 and the first sealing unit 110. The lower inorganic film 103 may further prevent permeation of moisture and/or oxygen into the organic light-emitting diode 20. The above-description of the first inorganic film 113 may be referred to as a description of the lower inorganic film 103.

The sealing layer 100 may have a thickness of from about 0.1 μm to about 1000 μm, and in some embodiments, a thickness of from about 1 μm to about 10 μm, but is not limited thereto. When the thickness of the sealing layer 100 is within these ranges, the sealing layer 100 may effectively prevent permeation of moisture and/or oxygen into the light-emitting diode 20, and have flexibility.

Although not shown in the Figure, at least one of a capping layer and a protective layer may be further disposed between the light-emitting diode 20 and the capping layer 100.

The capping layer may induce constructive interference of light emitted from the light-emitting diode 20, and thus enhance light extraction efficiency. The capping layer may comprise a material having a relatively high refractive index. For example, the capping layer may include an organic metal complex, such as $Alq_3$, a silicon oxide, or a silicon nitride, but is not limited thereto.

The protective layer may prevent damage of the light-emitting diode 20, which may occur during the formation of the sealing layer 100. For example, the protective layer may include a silicon oxide or a silicon nitride, but is not limited thereto.

A method of manufacturing the organic light-emitting device 1 of the Figure, according to an embodiment, will be described below.

First, the light-emitting diode 20 may be formed on the substrate 100. The first electrode 21 and the second electrode 25 of the light-emitting diode 20 may be formed in the same manner as described above.

Layers constituting the organic layer 23 (for example, a HIL, a HTL, a buffer layer, an ETL, an EIL, and the like) may be formed using any method selected from among a variety of known methods, such as vacuum deposition, spin coating, casting, or Langmuir-Blodgett (LB) deposition. If the organic layer 23 is formed using vacuum deposition, the deposition conditions may vary according to the material that is used to form the organic layer 23, and the structure and thermal characteristics of the organic layer 23 to be formed. For example, the deposition conditions may be selected from the following conditions: a deposition temperature of about 100° C. to about 500° C., a degree of vacuum of about $10^{-10}$ to about $10^{-3}$ torr, and a deposition rate of about 0.01 to 100 Å/sec. If the organic layer 23 is formed using spin-coating, the coating conditions may vary according to the material and the target structure and thermal characteristics of the organic layer 23 to be formed. For example, the coating conditions may be selected from among the following conditions: a coating rate of from about 2000 rpm to about 5000 rpm, and a thermal treatment temperature of from about 80° C. to about 200° C. at which a solvent used may be removed after the coating.

Subsequently, the lower inorganic film 103 may be formed to cover the light-emitting diode 20 using sputtering, reactive sputtering, chemical vapor deposition (CVD), plasma-enhanced chemical vapor deposition (PECVD), evaporation, electron cyclotron resonance plasma-enhanced chemical vapor deposition (ECR-PECVD), physical vapor deposition, atomic-layer deposition, or the like. The thickness and material of the lower inorganic film 103 may be the same as described above.

Next, a composition for forming the first inorganic film 111 is applied onto the lower inorganic film 103, and then cured, thereby forming the first organic film 111. The above-description of the "organic film forming composition", including in terms of thickness, may be referred to as a detailed description of the composition for forming the first organic film 111.

A method of applying the composition for forming the first organic film 111 onto the lower inorganic film 103 may be any of a variety of known methods, such as flash evaporation, spin coating, dip coating, inkjet printing, or the like, but is not limited thereto. A method of curing the composition for forming the first organic film 111 applied onto the lower inorganic film 103 may be any known methods of exposure to light, for example, UV curing, infrared ray curing, laser curing, or the like, but is not limited thereto.

Subsequently, the first inorganic film 113 is formed on the first organic film 111, thereby forming the first sealing unit 110. The first inorganic film 113 may be formed using sputtering, reactive sputtering, chemical vapor deposition (CVD), plasma-enhanced chemical vapor deposition (PECVD), evaporation, electron cyclotron resonance plasma-enhanced chemical vapor deposition (ECR-PECVD), physical vapor deposition, atomic-layer deposition, or the like. For example, the first inorganic film 113 may be formed using reactive sputtering or chemical vapor deposition (CVD) using oxygen gas or oxygen plasma, but is not limited thereto. The material and thickness of the first inorganic film 113 may be the same as described above.

Even when the first inorganic film 113 is formed by the method using a relatively high energy as described above, the first organic film 111 underlying the first inorganic film 111 may still have a highly cross-linked rigid network structure of polymer due to the inclusion of a cured product of the organic film forming composition containing the silicon-based compound with at least two terminal groups represented by Formula 1 as described above. Furthermore, even when forming the first inorganic film 111 using a high-energy film formation method, for example, in an oxygen plasma, Si—C bonds in the first organic film 111 may still remain, for example, in the form of $SiO_2$, via conversion to Si—O bonds as a result from reaction with oxygen ions or oxygen radicals generated from the oxygen plasma, so that damage and/or decomposition of the first organic film 111 caused by outgassing may substantially be prevented.

Next, the second organic film 121 is formed on the first inorganic film 113 and the second inorganic film 123 is formed on the second organic 121 to form the second sealing unit 120 on the first sealing unit 110. The above-described materials, thicknesses, and methods for forming the first organic film 111 and the first inorganic film 113 may be referred to as descriptions of the second organic film 121 and the second inorganic film 123.

Even when the second inorganic film 123 is formed by the method using a relatively high energy as described above, the second organic film 121 underlying the second inorganic film 123 may still have a highly cross-linked rigid network structure of polymer due to the inclusion of a cured product of the organic film forming composition containing the silicon-based compound with at least two terminal groups represented by Formula 1 as described above. Furthermore, even when forming the second inorganic film 123 using a high-energy film formation method, for example, in an oxygen plasma, Si—C bonds in the second organic film 121 may still remain, for example, in the form of $SiO_2$, via conversion to Si—O bonds as a result from reaction with oxygen ions or oxygen radicals generated from the oxygen plasma, so that damage and/or decomposition of the second organic film 121 caused by outgassing may substantially be prevented.

As a last operation, the third organic film 131 is formed on the second inorganic film 123 and the third inorganic film 133 is formed on the third organic 131 to form the third sealing unit 130 on the second sealing unit 120. The above-described materials, thicknesses, and methods for forming the first organic film 131 and the first inorganic film 113 may be referred to as descriptions of the third organic film 131 and the third inorganic film 133.

Even when the third inorganic film 133 is formed by the method using a relatively high energy as described above, the third organic film 131 underlying the third inorganic film 133 may still have a highly cross-linked rigid network structure of polymer due to the inclusion of a cured product of the organic film forming composition containing the silicon-based compound with at least two terminal groups represented by Formula 1 as described above. Furthermore, even when forming the third inorganic film 133 using a high-energy film formation method, for example, in an oxygen plasma, Si—C bonds in the third organic film 131 may still remain, for example, in the form of $SiO_2$, via conversion to Si—O bonds as a result from reaction with oxygen ions or oxygen radicals generated from the oxygen plasma, so that damage and/or decomposition of the third organic film 131 caused by outgassing may substantially be prevented.

Therefore, the organic light-emitting device 1 with the sealing layer 100 may have improved lifetime.

Although not illustrated, for a structure with at least one of the capping layer and the protective layer between the light-emitting diode 20 and the capping layer 100, the at least one of the capping layer and the protective layer may be formed on the light-emitting diode 20 before forming the sealing layer 100.

Although the present embodiments are described above with reference to the organic light-emitting device 1 of the Figure including three sealing units (n=3), embodiments are not limited thereto. For example, regarding the sealing layer of the organic light-emitting device 1, n may be 1 or greater, for example, may be an integer from 1 to 10. In some embodiments, n may be 1, 2, 3, 4, or 5; but the sealing layer of the organic light-emitting device 1 is not limited thereto. In some other embodiments, when the sealing layer of an organic light-emitting device includes at least two sealing units, another layer (for example, any organic layer and/or inorganic layer available as sealing layer of existing organic light-emitting devices) may be further disposed between adjacent sealing units. In some other embodiments, the lower inorganic layer 103 of the sealing layer 100 in Figure may be excluded.

As used herein, the expression "(at least two different layers are) sequentially stacked" means that at least two different layer are disposed upon one another in a vertical direction. In this regard, a method of stacking at least two different layers is not particularly limited, and may be any of a variety of methods known in the art. Furthermore, another layer may be interposed between the at least two different layers.

Hereinafter, the present embodiments will be described in detail with reference to the following synthesis examples and other examples. However, these examples are for illustrative purposes only and are not intended to limit the scope of the present embodiments.

EXAMPLES

Example 1

The compounds listed in Table 1, each in an amount in Table 1, were mixed together, and filtered through a 0.2 μm cylinder filter to prepare an organic film forming composition:

TABLE 1

| | Compound | Amount |
|---|---|---|
| Silicon-based compound | 1,3-bis(2-methacryloxypropyl)-tetramethyl disiloxane (Mw 386.64) | 40 mmol |
| Curable material | 1,10-decamethylene glycol dimethacrylate (Mw 310.43) | 40 mmol |
| | Trimethylolpropane triacrylate (Mw 296.32) | 20 mmol |
| Initiator | TPO | 4 mmol |

The organic film forming composition was applied on a silicon wafer using a flash evaporation system (available from SNU), and then exposed to a light source having a wavelength of about 390 nm to form an organic film.

The silicon wafer with the organic film was loaded onto a PECVD system, and was then exposed to an oxygen plasma condition (50 W, 100 mtorr, $O_2$ 50 sccm) for about 0 sec, 60 sec, 90 sec, and 120 sec, followed by measuring thicknesses of the organic film. The results are shown in Table 2 below.

TABLE 2

| Oxygen plasma exposure time | Measured thickness of organic film |
|---|---|
| 0 sec | 4198 Å |
| 60 sec | 4179 Å |
| 90 sec | 4166 Å |
| 120 sec | 4148 Å |

Example 2

An organic film was formed on a silicon wafer in the same manner as in Example 1, except that compounds of Table 3 below, instead of the compounds of Table 1, were used.

TABLE 3

| | Compound | Amount |
|---|---|---|
| Silicon-based compound | 1,3-bis(2-methacryloxypropyl)-tetramethyl disiloxane (Mw 386.64) | 40 mmol |
| Curable material | 1,10-decamethylene glycol dimethacrylate (Mw 310.43) | 50 mmol |
| | Trimethylolopropane triacrylate (Mw 296.32) | 10 mmol |
| Initiator | TPO | 4 mmol |

The silicon wafer with the organic film was loaded onto a PECVD system, and was then exposed to an oxygen plasma condition (50 W, 100 mtorr, $O_2$ 50 sccm) for about 0 sec, 60 sec, 90 sec, and 120 sec, followed by measuring thicknesses of the organic film. The results are shown in Table 4 below.

TABLE 4

| Oxygen plasma exposure time | Measured thickness of organic film |
|---|---|
| 0 sec | 3090 Å |
| 60 sec | 3020 Å |
| 90 sec | 3019 Å |
| 120 sec | 2994 Å |

Example 3

An organic film was formed on a silicon wafer in the same manner as in Example 1, except that compounds of Table 5 below, instead of the compounds of Table 1, were used.

TABLE 5

| | Compound | Amount |
|---|---|---|
| Silicon-based compound | 1,3-bis(2-methacryloxypropyl)-tetramethyl disiloxane (Mw 386.64) | 50 mmol |
| Curable material | triethylene glycol dimethacrylate (triethylene glycol dimethacrylate) (Mw 286.32) | 50 mmol |
| Initiator | BAPO | 2 mmol |

The silicon wafer with the organic film was loaded onto a PECVD system, and was then exposed to an oxygen plasma condition (50 W, 100 mtorr, $O_2$ 50 sccm) for about 0 sec, 60 sec, 90 sec, and 120 sec, followed by measuring thicknesses of the organic film. The results are shown in Table 6 below.

TABLE 6

| Oxygen plasma exposure time | Measured thickness of organic film |
|---|---|
| 0 sec | 4980 Å |
| 60 sec | 4971 Å |
| 90 sec | 4965 Å |

Comparative Example 1

The compounds listed in Table 7, each in an amount in Table 1, were mixed together, and filtered through a 0.2 μm cylinder filter to prepare an organic film forming composition.

TABLE 7

| | Compound | Amount |
|---|---|---|
| Silicon-based compound | — | — |
| Curable material | Lauryl acrylate (Mw 240.38) | 20 mmol |
| | 1,12-Dodecanediol dimethacrylate (Mw 338.43) | 70 mmol |
| | Trimethylolpropane triacrylate (Mw 296.32) | 10 mmol |
| Initiator | TPO | 4 mmol |

The organic film forming composition was applied on a silicon wafer using a flash evaporation system (available from SNU), and then exposed to a light source having a wavelength of about 390 nm to form an organic film.

The silicon wafer with the organic film was loaded onto a PECVD system, and was then exposed to an oxygen plasma condition (50 W, 100 mtorr, $O_2$ 50 sccm) for about 0 sec, 60 sec, 90 sec, and 120 sec, followed by measuring thicknesses of the organic film. The results are shown in Table 8 below.

TABLE 8

| Oxygen plasma exposure time | Measured thickness of organic film |
|---|---|
| 0 sec | 2205 Å |
| 30 sec | 2109 Å |
| 60 sec | 2055 Å |
| 90 sec | 2086 Å |

Evaluation Example 1

Evaluation of Resistance of Organic Film Against Oxygen Plasma

The thicknesses of the organic films of Examples 1 to 3 and Comparative Example 1 at an oxygen plasma exposure time of 0 second and 60 seconds, and the reduced thicknesses (degrees of outgassing) thereof after the exposure to oxygen plasma for 60 seconds were summarized in Table 9 below.

TABLE 9

|  | Organic film thickness in Example 1 | Organic film thickness in Example 2 | Organic film thickness in Example 3 | Organic film thickness in Comparative Example 1 |
|---|---|---|---|---|
| Oxygen plasma treatment (0 sec) | 4198 Å | 3090 Å | 4980 Å | 2205 Å |
| Oxygen plasma treatment (60 sec) | 4179 Å | 3020 Å | 4971 Å | 2055 Å |
| Reduced thickness of organic film (Degree of outgassing) | 19 Å | 70 Å | 9 Å | 150 Å |

Referring to Table 9, the organic films of Examples 1 to 3 are found to have reduced smaller changes in film thickness after the exposure to oxygen plasma, indicating as having greater resistance against oxygen plasma as compared with the organic film of Comparative Example 1.

Example 4

A glass substrate with an organic light-emitting diode including a first electrode, an organic layer, and a second electrode was prepared. After deposition of Alq3 to form a first capping layer having a thickness of about 680 Å covering the organic light-emitting diode, LiF was deposited on the first capping layer to form a second capping layer having a thickness of about 500 Å, followed by forming a sealing layer through the following processes:
  i) depositing $Al_2O_3$ on the second capping layer to form a lower inorganic layer having a thickness of about 1000 Å;
  ii) forming a first organic film having a thickness of about 1 μm on the lower inorganic layer in the same manner as in Example 3;
  iii) depositing $Al_2O_3$ on the first organic film to form a first inorganic film having a thickness of about 500 Å;
  iv) forming a second organic film having a thickness of about 1 μm on the first inorganic film in the same manner as in Example 3;
  v) depositing $Al_2O_3$ on the second organic film to form a second inorganic film having a thickness of about 500 Å;
  vi) forming a third organic film having a thickness of about 1 μm on the second inorganic film in the same manner as in Example 3; and
  vii) depositing $Al_2O_3$ on the third organic film to form a third inorganic film having a thickness of about 500 Å, thereby completing formation of an organic light-emitting device.

Comparative Example 2

An organic light-emitting device was manufactured in the same manner as in Example 4, except that the method of Comparative Example 1, instead of the method of Example 3, was used in forming the first organic film, the second organic film, and the third organic film.

Evaluation Example 2

Lifetime Evaluation of Organic Light-Emitting Device

After observation of initial screen statuses of the organic light-emitting devices of Example 4 and Comparative Example 2 using a microscope, the organic light-emitting devices of Examples 4 and Comparative Example 2 were stored at a temperature of 85° C. and a relative humidity of 85% for about 120 hours, and then microscopically observed. As a result, the organic light-emitting device of Example 4 was found to include about 50 dark spots and the organic light-emitting device of Comparative Example 2 was found to include about 200 dark spots. This indicates that the organic light-emitting device of Example 4 has improved lifetime characteristics as compared with the organic light-emitting device of Comparative Example 2.

As described above, according to the one or more embodiments, a sealing layer of an organic light-emitting device may prevent permeation of moisture and/or oxygen into a light-emitting diode for a long time, so that the organic light-emitting device including the sealing layer may have increased lifetime.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:
1. An organic light-emitting device comprising:
a substrate;
a light-emitting diode disposed on the substrate and comprising a first electrode, an emission layer, and a second electrode; and
a sealing layer covering the light-emitting diode,
wherein the sealing layer comprises n number of sealing units, each comprising a sequential stack of an organic film and an inorganic film, wherein n is an integer of 1 or greater, and wherein an outer layer of the sealing layer is an inorganic film; and
the organic film comprises a cured product of an organic film forming composition including a silicon-based compound with at least two terminal groups represented by Formula 1 below:

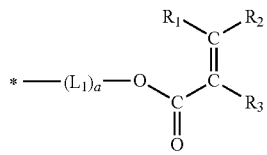

<Formula 1> wherein, in Formula 1 above,
L₁ is a substituted or unsubstituted $C_1$-$C_{60}$ alkylene group or a substituted or unsubstituted $C_2$-$C_{60}$ alkenylene group;
a is an integer from 0 to 2; and
$R_1$ to $R_3$ are each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstiuted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

2. The organic light-emitting device of claim 1, wherein, in Formula 1, $L_1$ is one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acod group or a salt thereof, and a phosphoric acid group or a salt thereof.

3. The organic light-emitting device of claim 1, wherein, in Formula 1, $R_1$ to $R_3$ are each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; a $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof.

4. The organic light-emitting device of claim 1, wherein, in Formula 1, $R_1$ and $R_2$ are a hydrogen atom, and $R_3$ is a methyl group.

5. The organic light-emitting device of claim 1, wherein, in Formula 1, a is 1.

6. The organic light-emitting device of claim 1, wherein the silicon-based compound is a compound represented by Formula 2 or 3 below:

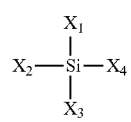

<Formula 2>

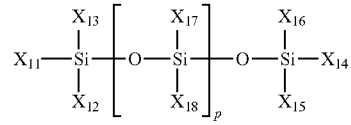

<Formula 3> wherein, in Formulae 2 and 3,
$X_1$ to $X_4$ and $X_{11}$ to $X_{18}$ are each independently a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or a terminal group represented by Formula 1, wherein at least two of $X_1$ to $X_4$ are terminal groups represented by Formula 1, and at least two of $X_{11}$ to $X_{18}$ are terminal groups represented by Formula 1; and
p is an integer from 0 to 10.

7. An organic light-emitting device comprising:
a substrate;
a light-emitting diode disposed on the substrate and comprising a first electrode, an emission layer, and a second electrode; and a sealing layer covering the light-emitting diode,
wherein the sealing layer comprises n number of sealing units, each comprising a sequential stack of an organic film and an inorganic film, wherein n is an integer of 1 or greater, and wherein an outer layer of the sealing layer is an inorganic film; and
the organic film comprising a cured product of an organic film forming composition including a silicon-based compound represented by Formula 3A below:

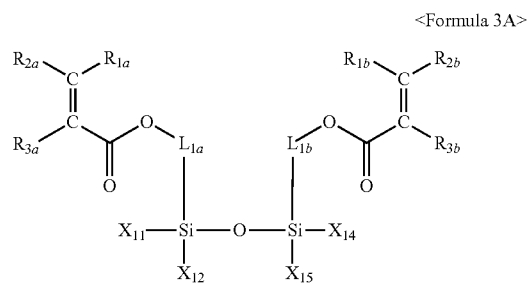

<Formula 3A> wherein, in Formula 3A, $L_{1a}$ and $L_{1b}$ are each independently one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof; and $R_{1a}$, $R_{2a}$, $R_{3a}$, $X_{11}$, $X_{12}$, $R_{1b}$, $R_{2b}$, $R_{3b}$, $X_{14}$ and $X_{15}$ are each independently one of a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof.

8. The organic light-emitting device of claim 1, wherein the organic film forming composition further comprises a curable material and an initiator.

9. The organic light-emitting device of claim 8, wherein the curable material comprises at least one of an acrylate-based material, a methacrylate-based material, a vinyl-based material, an epoxy-based material, a urethane-based material, and a cellulose-based material.

10. The organic light-emitting device of claim 8, wherein the initiator comprises at least one of an organic peroxide-based compound, an azo-based compound, a benzophenone-based compound, an oxime-based compound, and a phosphine oxide-based compound.

11. The organic light-emitting device of claim 1, wherein the inorganic film comprises at least one of a metal, a metal nitride, a metal oxide, and a metal oxynitride.

12. The organic light-emitting device of claim 1, wherein the sealing layer further comprises a lower inorganic film disposed between the organic light-emitting diode and the sealing unit.

13. The organic light-emitting device of claim 1, further comprising at least one of a capping layer and a protective layer between the light-emitting diode and the sealing unit.

14. An organic light-emitting device comprising:
a substrate; an organic light-emitting diode disposed on the substrate and comprising a first electrode, an emission layer, and a second electrode; and a sealing layer covering the organic light-emitting diode,
wherein the sealing layer has a stack structure including a first organic film, a first inorganic film, a second organic film, a second inorganic film, a third organic film, and a third inorganic film that are sequentially stacked on the organic light-emitting diode, and wherein an outer layer of the sealing layer is an inorganic film;
the first organic film, the second organic film, and the third organic film each independently comprises a cured product of an organic film forming composition including a silicon-based compound represented by Formula 3A below; and
the first inorganic film, the second inorganic film, and the third inorganic film each independently comprise at least one of a metal, a metal nitride, a metal oxide, and a metal oxynitride

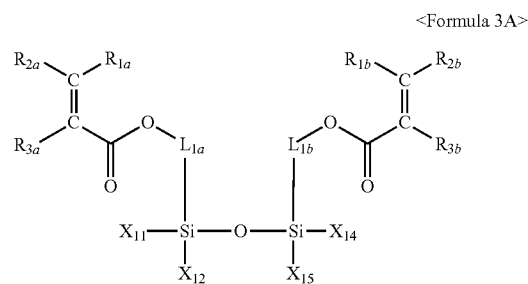

<Formula 3A> wherein, in Formula 3A,
$L_{1a}$ and $L_{1b}$ are each independently one of a $C_1$-$C_{10}$ alkylene group; and a $C_1$-$C_{10}$ alkylene group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof;
$R_{1a}$, $R_{2a}$, $R_{3a}$, $X_{11}$, $X_{12}$, $R_{1b}$, $R_{2b}$, $R_{3b}$, $X_{14}$, and $X_{15}$ are each independently a hydrogen atom, a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, a phosphoric acid group or a salt thereof; $C_1$-$C_{20}$ alkyl group; and a $C_1$-$C_{20}$ alkyl group substituted with at least one of a deuterium atom, a halogen atom, a hydroxyl group, a cyano group, a nitro group, an amino group an amidino group, a hydrazine, a hydrazone, a carboxyl group or a salt thereof, a sulfonic acid group or a salt thereof, and a phosphoric acid group or a salt thereof.

15. The organic light-emitting device of claim 14, wherein the sealing layer further comprises a lower inorganic film disposed between the organic light-emitting diode and the first organic film.

16. A method of manufacturing an organic light-emitting device, the method comprising:
forming an organic light-emitting diode comprising a first electrode, an emission layer, and a second electrode on a substrate; and
forming a sealing layer to cover the organic light-emitting diode, the sealing layer comprising at least n number of sealing units each including an organic film and an inorganic film sequentially stacked on the organic light-emitting diode, wherein n is an integer of 1 or greater, and wherein an outer layer of the sealing layer is an inorganic film;
wherein the organic film is formed by applying an organic film forming composition including a silicon-based compound with at least two terminal groups represented by Formula 1 below, onto a region where the organic film is to be formed, and curing the organic film forming composition:

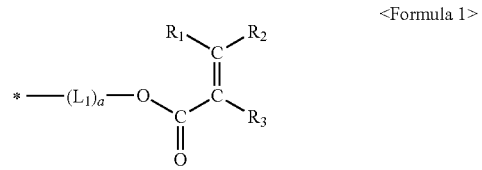

<Formula 1> wherein, in Formula 1,
$L_1$ is a substituted or unsubstituted $C_1$-$C_{60}$ alkylene group or a substituted or unsubstituted $C_2$-$C_{60}$ alkenylene group;

a is an integer from 0 to 2; and $R_1$ to $R_3$ are each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstiuted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

17. The method of claim 16, wherein the organic film forming composition is applied onto the region where the organic film is to be formed, by using flash evaporation, and the organic film forming composition is applied onto the region where the organic film is to be formed, is cured by being exposed to light.

18. The method of claim 16, wherein the organic film forming composition further comprises a curable material and an initiator.

19. The method of claim 16, wherein the inorganic film is formed by reactive sputtering or chemical vapor deposition (CVD) using oxygen gas or oxygen plasma.

20. The method of claim 16, wherein the sealing layer further comprises a lower inorganic film disposed between the organic light-emitting diode and the sealing unit.

* * * * *